(12) United States Patent
Rathfelder

(10) Patent No.: US 11,467,215 B1
(45) Date of Patent: Oct. 11, 2022

(54) BATTERY STORAGE CHARGE AND DISCHARGE MONITOR WITH IMPROVED BATTERY CAPACITY CALCULATION, IMPROVED CHARGE AND DISCHARGE MONITORING, DISCHARGE WHAT IF CALCULATIONS, AND MULTIPLE RE-CHARGE GOALS

(71) Applicant: Peter Rathfelder, Maricopa, AZ (US)

(72) Inventor: Peter Rathfelder, Maricopa, AZ (US)

( * ) Notice: Subject to any disclaimer, the term of this patent is extended or adjusted under 35 U.S.C. 154(b) by 0 days.

(21) Appl. No.: 17/858,773

(22) Filed: Jul. 6, 2022

(51) Int. Cl.
  *G01R 31/36* (2020.01)
  *G01R 31/371* (2019.01)
  *G06F 3/0488* (2022.01)
  *G01R 31/3842* (2019.01)
  *G01R 31/374* (2019.01)

(52) U.S. Cl.
  CPC ....... *G01R 31/3646* (2019.01); *G01R 31/371* (2019.01); *G01R 31/374* (2019.01); *G01R 31/3842* (2019.01); *G06F 3/0488* (2013.01)

(58) Field of Classification Search
  CPC ............ G01R 31/3646; G01R 31/3842; G01R 31/374; G01R 31/371

USPC ....................................................... 320/137
  See application file for complete search history.

(56) References Cited

U.S. PATENT DOCUMENTS

| | | | |
|---|---|---|---|
| 2021/0083506 A1* | 3/2021 | Rao | H02J 13/00002 |
| 2022/0091190 A1* | 3/2022 | Cox | G01R 31/367 |
| 2022/0137149 A1* | 5/2022 | Chueh | G01R 31/3648 702/63 |

\* cited by examiner

*Primary Examiner* — Nathaniel R Pelton
(74) *Attorney, Agent, or Firm* — Keith L. Jenkins, Registered Patent Attorney LLC; Keith L. Jenkins

(57) ABSTRACT

A predictive energy monitoring system which, during discharge, accounts for changes in available energy remaining as a result of changes in battery environmental temperature, changes in energy used by systems which cycle on and off, and which provides a user "What-if" capability to predict energy availability time remaining by changing systems in use. The present invention also covers the reporting of re-charge completion against multiple re-charge goals. The battery monitoring system includes a non-volatile memory, sensors, a processor that receives inputs from the sensors and receives inputs from a user through a touch screen graphic user interface, the processor then makes calculations responsive to sensor inputs and user inputs, and supplies data to a display for presenting a plurality of screen images representing the results of the calculations.

20 Claims, 5 Drawing Sheets

300 →

RV Battery Monitor

| | | |
|---|---|---|
| Battery Capacity: | 75 | amp-hrs. |
| | 480 | watt-hrs. (derated) |
| Battery Status: | Discharging | |
| Rate: | 3.42 | amperes — 304 |
| | 40.4 | watts — 306 |
| | 9.8 | % Discharge/hr. — 308 |
| Current Status: | | — 302 |
| Voltage: | 11.81 | volts |
| Power in Use: | 18.4 | amp-hrs. (derated) |
| Capacity in Use: | 175.8 | watt-hrs. (derated) |
| Changes in Energy Draw: | Steady | — 310 |
| | *(Steady or Variable)* | |
| Cumulative: | 4.81 | amp-hrs. used — 312 |
| | 57.7 | watt-hrs. used — 314 |
| Temperature: | 84 | degF. — 316 |
| Cumulative Time of Discharge | 3.2 | hours |

*Display of Standard Electrical Parameters*

FIG. 3

BATTERY STORAGE CHARGE AND DISCHARGE MONITOR WITH IMPROVED BATTERY CAPACITY CALCULATION, IMPROVED CHARGE AND DISCHARGE MONITORING, DISCHARGE WHAT IF CALCULATIONS, AND MULTIPLE RE-CHARGE GOALS

FIELD OF THE INVENTION

The present disclosure relates to a system which monitors stored energy, reports energy remaining in electrical units and in units of time, improves accuracy charging completion and discharge energy time remaining by multiple samplings of current energy usage with differing time averages, and provides the user with a what-if capability to display changed energy time remaining based upon enabling or disabling different energy using systems.

BACKGROUND

Consumer users of battery storage systems need improved capability to manage the energy storage in accurate and easy to understand units of measure. Most battery storage usage and charging monitor systems report battery status in terms of electrical parameters such as voltage, current, wattage and watt-time parameters. These units of measure require notable calculations by the user to estimate battery capacity remaining. In addition, monitors are available which report a value for "Useful Time Remaining". These monitors calculate "Energy Useful Time Remaining" instantaneously, based only upon a measure of battery capacity remaining and instantaneous power usage. Energy using systems which cycle, result in instantaneous readouts of "Energy Useful Time Remaining" which can fluctuate greatly between the cycling system "on" and "off" states. Inaccuracy results from this simplistic calculation of "Energy Useful Time Remaining".

BRIEF SUMMARY

The present invention presents a predictive energy monitoring system which during discharge, accounts for changes in available energy remaining as a result of changes in battery environmental temperature, changes in energy used by systems which cycle on and off, and which provides a user "What-if" capability to predict energy availability time remaining by changing systems in use. The present invention also covers the reporting of re-charge completion against multiple re-charge goals.

The battery monitoring system includes a non-volatile memory, sensors, a processor that receives inputs from the sensors and receives inputs from a user through a touch screen graphic user interface, the processor then makes calculations responsive to sensor inputs and user inputs, and supplies data to a display for presenting a plurality of screen images representing the results of the calculations.

The present invention introduces four improvements in a battery storage monitoring system during charge and discharge cycles which provide: improvements in the de-rating of battery capacity for factors of battery type combined with battery age, battery number of charge/discharge cycles and current battery environmental temperature, are used in calculating remaining battery energy.

The ability to perform more accurate calculations of "Energy Useful Time Remaining" during battery discharge with energy using systems which a) cannot be turned off such as safety systems, b) "In Use" systems drawing constant energy and c) the "In Use" but intermittent systems using energy. Intermittent energy using systems can include but are not limited to HVAC systems, pumps and AC refrigerators.

The ability to store values of the energy usage of different systems connected to the battery, then to allow the user to "what-if" the on/off state of the different systems. The user can what-if test the different energy usage systems if they are to be engaged or disengaged. The unit then predicts the resulting remaining battery useful time based upon the new, resultant energy usage configuration.

During a re-charge cycle, the monitoring system calculates and reports progress toward two re-charge goals: progress toward a full recharge, and progress toward a partial re-charge which should provide enough energy storage to meet the need for the next 24 hours, based upon stored averages of previous day's energy usage, with an additional safety amount of over storage (replenishment).

BRIEF DESVRIPTION OF THE DRAWAINGS

The present invention will hereinafter be described in conjunction with the following drawing figures, wherein like numerals denote like elements, and FIG. 1 is a diagrammatic view illustrating a prior art current measurement circuit used in the present invention;

FIG. 3 is a monitor display view illustrating an exemplary embodiment of a "standard electrical parameters" screen, in accordance with a preferred embodiment of the present invention;

DETAILED DESCRIPTION

Figure 1:
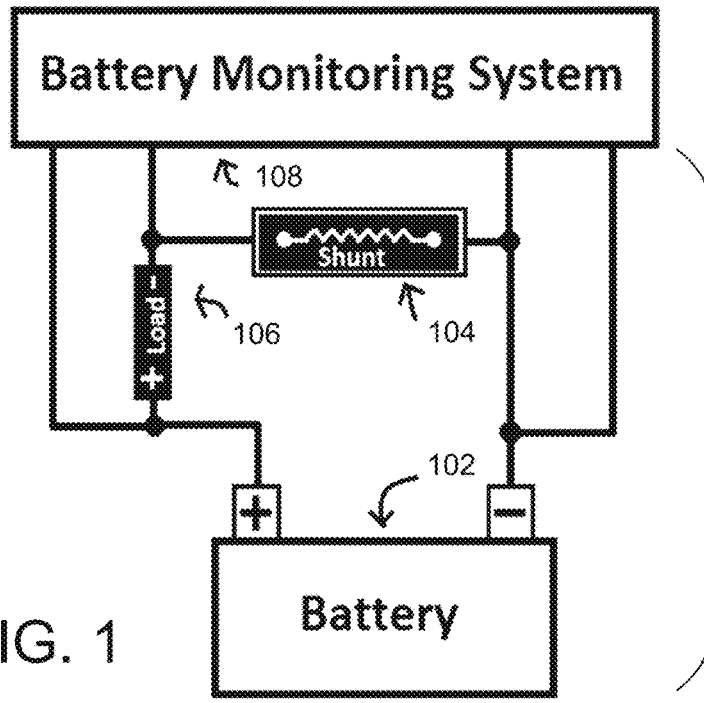

As used and defined herein, "What-if" means a capability to generate a hypothetical battery powered load configurations and receive a calculation of how much time the battery can sustain such hypothetical load configuration. Various hypothetical load configurations may be made, one at a time.

User Setup

When the battery is new, the type of battery 102 (lead acid or lithium) is entered into the monitoring system. For lead acid batteries, the battery type, "standard" or "deep cycle" is entered into the monitoring system 108. The battery rating in amp-hrs. is next entered into the monitoring system 108. The monitoring system 108 then multiplies the amp-hrs. value by sixty to arrive at the same amount in amp-minutes. The present invention applies to battery operated systems where off-the-shelf standard batteries 102 are used, which do not contain any battery monitoring electronic components within the battery 102 itself. In some embodiments, the battery 102 may be a plurality of interconnected batteries.

The benchmark energy usage in amperes of each of the user's energy consuming systems (Sys_amp_#) is entered into the energy monitoring system 108 via data transfer or is hand entered and is stored in the monitoring system's 108 non-volatile memory. This includes energy consuming systems 410 (see FIG. 5) which must remain continuously on. Examples of this include fire alarms and gas leakage alarms. Even if all switchable systems are turned off, some electrical usage remains from un-switchable systems. The user indicates via the touch screen 412 (see FIG. 5) whether an energy consuming system is required to remain continuously on. The energy monitoring system records this value as a data marker in permanent memory.

Discharge Mode Monitoring

The battery monitoring system 108 requires a starting point of battery 102 in full charge at the point of first power on. After power on, if the battery monitoring system 108 detects a previous discharge cycle of greater than one hour, the battery monitoring system 108 records the beginning of an energy discharge as a digital record InitDis in the system's permanent memory.

Next, the battery monitoring system 108 begins to continuously monitor battery voltage, and energy flow (current). The method of measuring the energy flow in and out of the storage battery is known in the art. A diagram of the circuit is shown in FIG. 1. The instantaneous current being consumed by the operator's useful load 106 is measured via a high current, low resistance value shunt 104. The power measurement is calculated as the instantaneous current value in amperes times the instantaneous battery voltage, averaged over a sixty second period resulting in a watt-minute value. The current and power measurement techniques are known in the art and are shown for illustrative purposes. A direct connection to the battery 108 positive terminal is used to power and recharge the battery monitoring system 102 and to detect the battery voltage.

Figure 2:
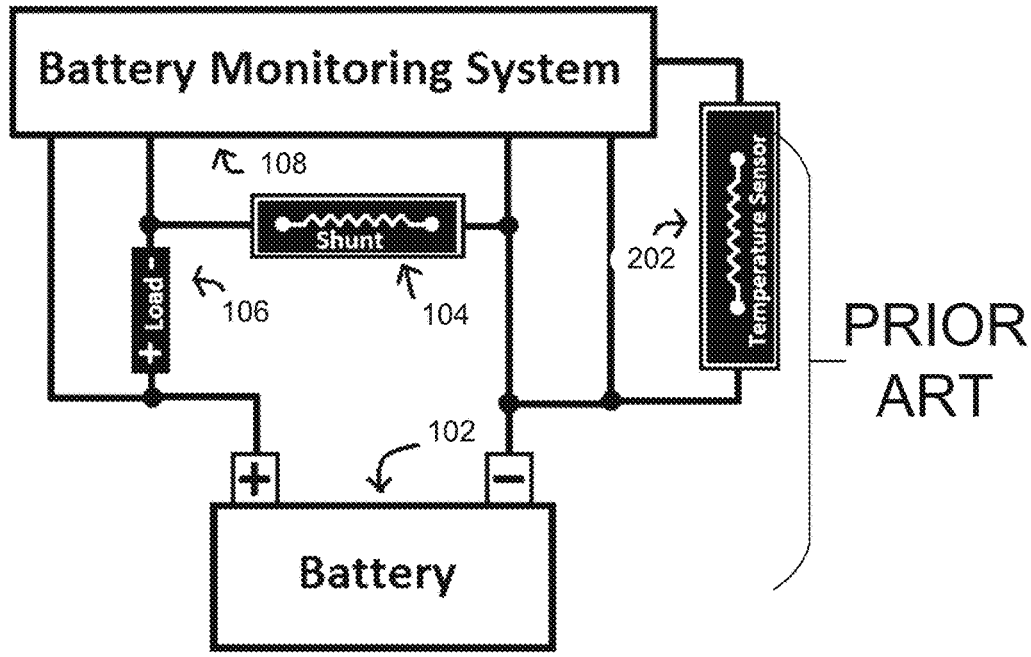
FIG. 2 is a diagrammatic view illustrating the prior art current measurement circuit of FIG. 1 with a battery environmental temperature sensor added, as used in the present invention.

The monitoring system also measures the environmental temperature near the battery position. FIG. 2 shows a standard thermocouple 202 used for the measurement. This is the complete representation of the external circuit connections to the monitoring system. Note that there are no additional sensing components external to the measurement system.

FIG. 3 is a monitor display view illustrating an exemplary embodiment of a "standard electrical parameters" screen 300, in accordance with a preferred embodiment of the present invention;

The monitoring system then displays the standard electrical parameters (see FIG. 3) of battery voltage 302 (see FIG. 3) current being consumed in amperes 304, energy wattage being consumed 306, battery percent discharged 308, an indicator of "steady" or "varying" discharge 310, cumulative values of amp-hrs. used 312, watt-hrs. used 314 and clock cumulative time of discharge 316.

The present invention can monitor in cases where some energy usage systems cannot be switched off. Examples of this include, without limitation, fire alarms and gas leakage alarms. Even if all switchable systems are turned off, some electrical usage remains from un-switchable systems. The amount of energy consumed by the energy usage systems which cannot be turned off is entered by the user as described in the User Setup section above. The energy drain from un-switchable systems is used during the "What-If" calculations (below).

Discharge Mode Calculations

The battery monitoring system 108 performs calculations of the energy discharge when a discharge mode is detected. First, the battery monitoring system 108 de-rates the battery capacity for "standard usable capacity" to prevent battery damage. The standard lead-acid battery 102 capacity is derated 50%. The deep-cycle lead-acid battery 102 capacity is derated 35%. The lithium battery 102 capacity is derated 20%. The de-rated capacity is used in subsequent discharge calculations and predictions.

For subsequent calculation, the energy monitoring system 108 creates a fixed battery capacity value, derated by only battery type and "standard usable capacity". This value (BcapFixed) in watt-minutes is stored in the battery monitoring system's 108 permanent memory. For calculation, a fixed value of the power consumed by each of the energy consuming systems (Sys_amp_#) is multiplied by an average battery voltage of 10.8V to arrive at a fixed power consumption value for each energy consuming system (Sys_watt_#).

Next, the battery monitoring system 108 de-rates the battery capacity by the number of charge/discharge cycles. Data of the battery charge/discharge cycles is stored in the monitoring system's non-volatile memory. The memory location is indexed for each charge/discharge cycle pair. The de-rating is calculated as a linear function with a 40% derating for 500 cycles for a standard lead acid battery 102, a 40% derating for 800 cycles for a deep cycle lead acid battery 102, and a 20% derating for 2,000 cycles for a lithium battery 102. This de-rated capacity is calculated upon startup of the battery monitoring system 108 and stored in the battery monitoring system's 108 permanent memory. The updated standard usable capacity value is then used in subsequent discharge calculations and predictions.

The measurement of the battery environmental temperature (typically, air temperature) near the battery is used by the monitoring system to continuously calculate reduced standard usable battery capacity versus battery environmental temperature. For the specific case of lead acid batteries, the battery 102 must be stored outdoors to eliminate the risk of dangerous vapors. For lithium batteries 102, the battery environmental temperature sensor 202 is placed in the vicinity of the source container. The battery monitoring system 108 continuously decreases the battery capacity rating based upon capacity lost due to lower battery environmental temperature. The battery capacity is derated for battery environmental temperature by 0.55% per degree Fahrenheit below 73 F. for lead acid, deep-cycle lead acid and lithium battery types. No change in capacity is calculated for battery environmental temperatures above 73 F.

The battery monitoring system 108 combines the battery capacity derating value, the combination of the de-rating steps above, and stores this value as B-CAPdr. The charge/discharge cycle derating and the temperature variation derating change values of B-CAPdr.

The battery monitoring system 108 calculates short-term and long-term averages of the energy drain from energy cycling systems (i.e. HVAC systems, pumps, etc.) by making instantaneous measurements of energy draw, which can include abrupt energy draw. The short-term average (EdrawShort) period is one minute. The long-term average (EdrawLong) period is thirty minutes.

In cases where the short term average and long term averages are within 20%, the short term average (EdrawShort) is used to calculate energy draw from the battery and the "Changes in Energy Draw" display 310 on the "RV Battery Monitor" screen 300 is displayed as "Steady". This allows the reporting of changes in the energy drain to the user once per minute.

If the short-term average and long-term average diverge by more than 20%, the long term average (EdrawLong) is used to calculate energy draw from the battery and the "Changes in Energy Draw" 310 display on the "RV Battery Monitor" 300 is displayed as "Varying". The final value, (Edraw avg) in watts, is selected from the value of EdrawShort or EdrawLong as described above. During each minute of the monitoring system in discharge operation, the instantaneous current value and instantaneous wattage value is updated in the battery monitoring system 108 permanent memory. The battery monitoring system 108 then records a summation of the wattage value in watt-minutes (DisChgTotCyc), used since the start of the discharge cycle.

In a similar manner, the battery monitoring system 108 creates a cumulative measure of total energy discharge during the previous day's 24-hour period and stores this value of total energy used as the parameter "DisChgTotal24". At midnight, the value of the previous day's total energy discharge, is stored as DisChgTotPrev. The value of DisChgTotal24 is cleared and the summation for the current day begins. Finally, the value of DisChgTotPrev from two days prior is deleted from the battery monitoring system's 108 memory.

Monitoring System Reporting During Discharge and "What-If" Capability

The battery monitoring system 108 now calculates the remaining battery capacity by subtracting the cumulative battery used (DisChgTotCyc) in watt-minutes from the fully derated battery capacity (B-CAPdr) in watt-minutes to arrive at the remaining battery capacity (CAPrem) also in watt-minutes, via the formula:

$$CAPrem \text{ (in watt-minutes)} = B\_CAPdr - DisChgTotCyc \quad \text{(eq. 1.)}$$

Figure 4:
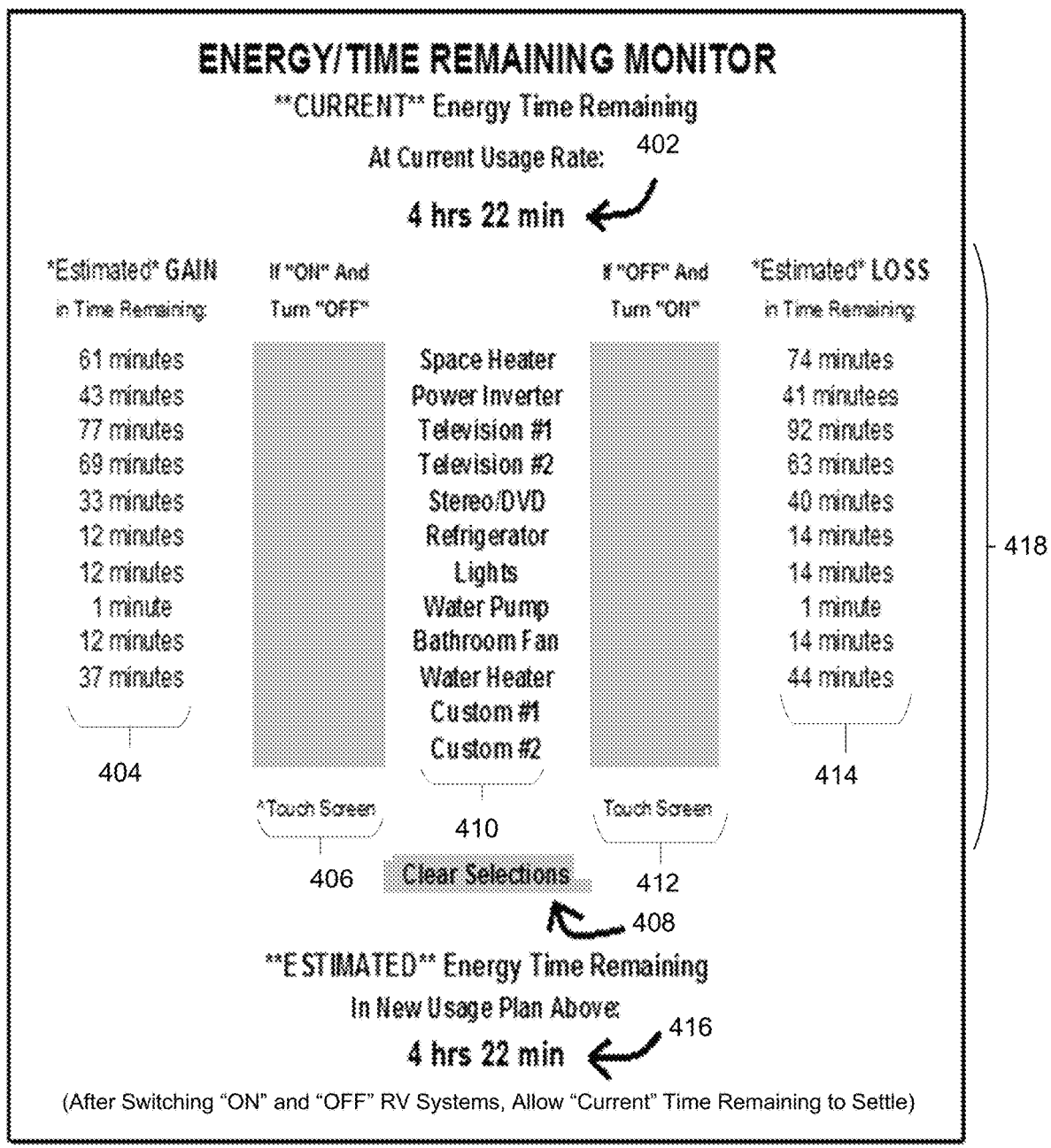
FIG. 4 is a monitor display view illustrating an exemplary embodiment of a "current energy time remaining" screen, in accordance with a preferred embodiment of the present invention.

FIG. 4 is a monitor display view illustrating an exemplary embodiment of a "current energy time remaining" screen 400, in accordance with a preferred embodiment of the present invention. Next "Energy/Time Remaining (ETR)" value 416 is calculated from the above value of remaining battery capacity (CAPrem) divided by the applicable short term or long-term average energy drain rate (EDRavg) via the formula:

$$ETR \text{ (in hours, minutes)} = CAPrem/Edraw\_avg \quad \text{(eq 2.)}$$

The "Energy/Time Remaining value" 416 (see FIG. 4) is reported to the user on the "ENRGY/TIME REMAINING MONITOR" 400. In FIG. 4, energy loads are part of the "What-If" Capability calculator now described. The battery monitoring system 108 provides a "What-if" calculation capacity to the user. The "What-if" system uses the values of energy use by system, entered as data into the monitoring system during set-up (see above). In the lower portion of FIG. 4, the "What-if" user section 418 is shown. The view of the "What-if" screen 400 depicts the "Idle" mode where no "What-if" requests are in progress. The "What-if" system provides a projection for a "Energy/Time Remaining (ETR)" value 416 if a change in energy using systems are turned off or on.

Figure 5:
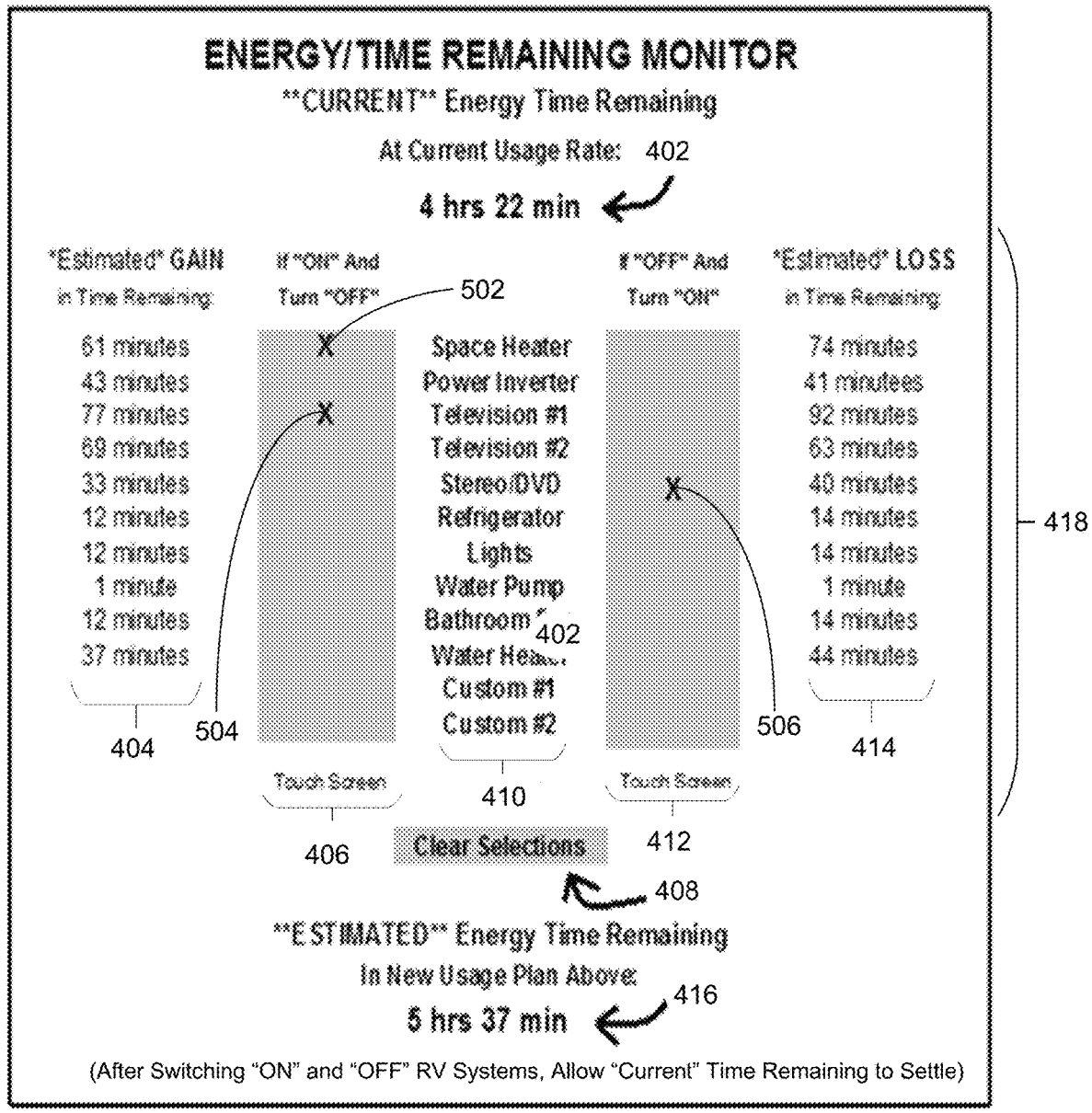
FIG. 5 is a monitor display view illustrating an exemplary embodiment of a "current energy time remaining" screen, in accordance with a preferred embodiment of the present invention.

FIG. 5 depicts a sample "What-if" energy request in progress. In the center of this touch screen section, a listing 410 of the energy using systems (electrical loads) is displayed. The listing of electrical loads 410 includes loads that are always on such as, without limitation, safety systems; loads that can be turned on or off and use a constant amount of energy such as, without limitation, televisions and lights; and intermittent loads such as, without limitation, HVAC systems, pumps and AC refrigerators. The left most column 404 shows an estimate of the Battery Energy/Time gained by turning off a switchable system which is currently in use (Tgain). The second from the left column 406 is a touch screen activated section allowing the user to select the line and request a "what-if prediction of Energy Time remaining 416, if that system is currently on and is switched off. Similarly, the right most column 414 shows an estimate of the Battery Energy/Time reduced by turning on a switchable system currently not in use (Tloss). Again, a touch screen section 412 is used to request a "what-if" prediction of Energy Time remaining, if that system is switched on.

Finally, below, a predicted "Energy Time Remaining Value" (PETR) is displayed 416 if the sum of the changes indicated to the switchable systems is made.

The estimated Tgain value is calculated as:

$$Tgain \text{ (hours, minutes)} = BcapFixed/Sys\_watt\_\# \quad \text{(eq. 3.)}$$

The estimate Tloss Value is calculated with an additional 20% safety factor as:

$$Tloss \text{ (hours, minutes)} = (BcapFixed/Sys\_watt\_\#)*1.2 \quad \text{(eq. 4.)}$$

The summation of the estimated time gain and time lost is calculated:

$$PETRnet \text{ (hour, minutes)} = Tgain - Tloss \quad \text{(eq. 5.)}$$

The predicted "Energy Time Remaining Value" (PETR) 416 is calculated as current "Energy/Time Remaining (ETR)" plus the net estimated gain/loss time:

$$PETR\text{(hours, minutes)} = ETR + PETRnet \quad \text{(eq. 6.)}$$

Using this method, the user can configure all the energy using systems 410, making on/off changes to arrive at a new overall energy use configuration to achieve a differing "Energy Time Remaining Value"416. After the user makes changes to the energy using systems in use, the predicted/current "Energy Time Remaining Value" 402 at the top of the display 500 will settle to the new estimated value 416. At all times, the continuous "Energy Time Remaining Value" 402 shows the actual predicted value. No sensors are placed within the individual energy using systems, so the user is depended upon to perform the on/off tasks to meet the new "Energy Time Remaining Value" 402. The battery monitoring system 108 does not turn electrical loads 410 on or off. Turning the electrical loads 410 on or off is achieved by the user using the power switches for the individual loads. To start a new hypothetical power use configuration, the user touches the "Clear Selection" window to remove all selections such as 502, 504, and 506 (see FIG. 5) for non-limiting example.

Charging Mode Monitoring

During battery 102 charging, the battery monitoring system 108 tracks the energy supplied to the battery 102 continuously. Continuously, the monitoring system automatically detects a state of "Discharge" or "Charging" based upon readings from the battery sensors 104, 106. The system shows the current state of the recharge cycle in standard electrical terms (FIG. 3). As noted above, the method of measuring the energy flow into the storage battery is standard practice. The instantaneous energy delivered to the battery 102 is measured via a high current, low resistance value shunt 104 as noted above.

Recharging Mode Calculations

The battery monitoring system 108 calculates two different goals for the energy recharge amount (charging goals): full recharge of the storage battery 102 (full charge goal); and partial recharge of the storage battery 102 enough to provide an average daily energy usage plus a safety amount (replenishment charge goal).

The battery monitoring system 108 stores short term and long-term averages of energy gain in an internal permanent memory to be used for accurate predictions of total re-charge amount. The short-term average (EgainShort) period is one minute. The long-term average (EgainLong) period is thirty minutes. In cases where the short-term average and long-term averages are within 20%, the short-term average (EgainShort) is used to calculate energy gain to the battery 102. This allows the reporting of changes in the energy charge to the user once per minute. If the short-term average and long-term average gain diverge by more than 20%, the long-term average (EgainLong) is used for the calculation. The final value, (Egain_avg) in watts, is selected for calculations from the value of either EgainShort or EgainLong as described above.

If the short term average (EgainLShort) is used for the calculation, the charging mode 602 is displayed 600 as "Constant". Conversely, if the long term average (EgainLShort) is used for the calculation, the charging mode 602 is displayed 600 as "Varying".

During each minute of the monitoring system in charging operation, the instantaneous current value and instantaneous wattage value is recorded in the monitoring system's permanent memory. The monitoring system then calculates a summation of the wattage values in watt-minutes (Egsum), since charging began.

If a discharge cycle has previously occurred, and a charging cycle has begun, the monitoring system calculates the current state of battery recharge. (No reporting of re-charge state is calculated if re-charge is the first operation detected by the system since monitoring system start or after reset.)

Figure 6:
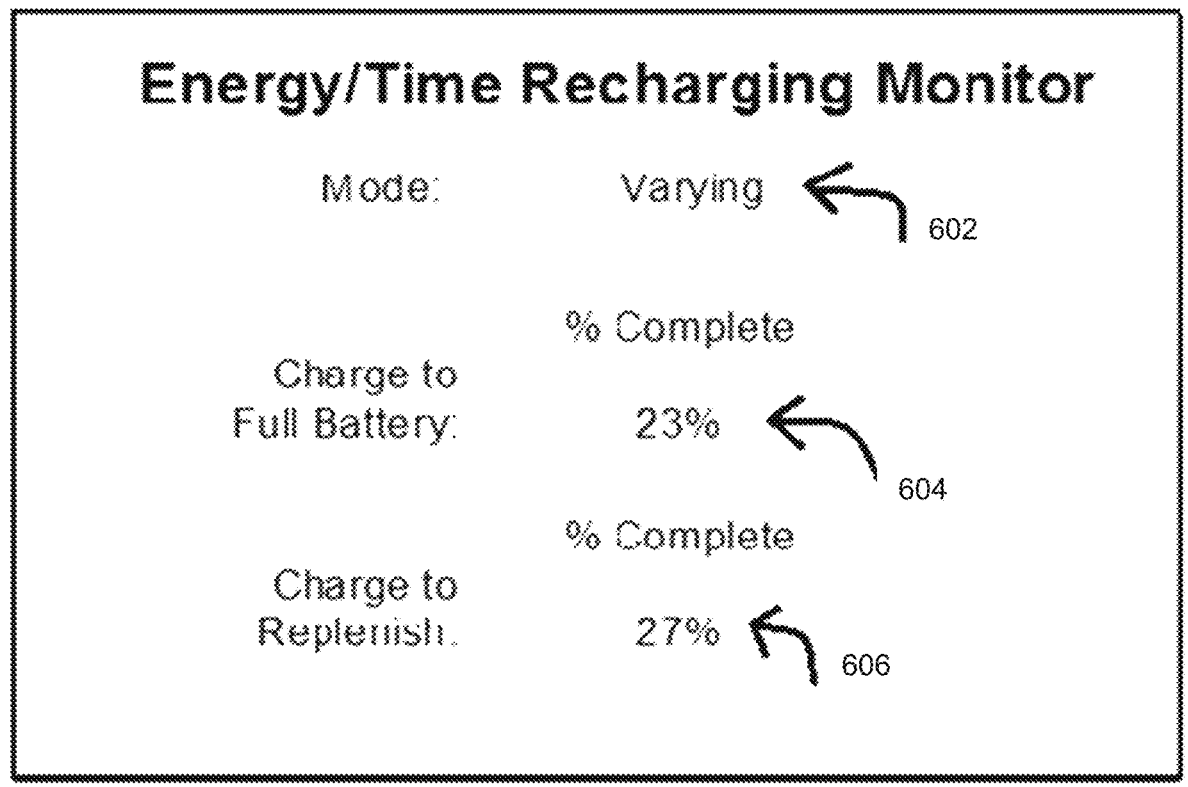
FIG. 6 is a monitor display view illustrating an exemplary embodiment of a "Energy/Time Recharging Monitor" screen, in accordance with a preferred embodiment of the present invention.

FIG. 6 is a monitor display view illustrating an exemplary embodiment of a "Energy/Time Recharging Monitor" screen 600, in accordance with a preferred embodiment of the present invention. Also the percent complete of the recharging toward full capacity 604 is displayed as the value (%Rcompfull), is calculated as the amount of battery capacity to be replaced divided by the summation of wattage recharged (Egsum).

$$\%Rcompfull = (B\_Caprep/Egsum)*100 \qquad \text{(eq. 7.)}$$

This result is displayed on the Energy/Time Recharging Monitor Screen 600.

The battery monitoring system also 108 calculates progress toward a replenishment recharge goal, 606, using records of energy usage during the previous full calendar twenty-four hour day (see above). The replenishment goal is calculated as the re-charge necessary to store enough energy to meet the previous day's energy usage plus a safety margin of 20%. For these calculations, the battery monitoring system 108 simply replaces the fully de-rated battery capacity for a value of the total previous day's discharge energy usage (DisChgTotalPrev) plus a margin of 20%.

$$B\_Caprep\_repl = (DisChgTotalPrev*1.2) - CAPrem \qquad \text{(eq. 8.)}$$

The percent complete of the recharge toward the replenishment goal, the value of percent recharge completed 606, is calculated as the amount of battery capacity used in the previous discharge cycle, plus a 20% margin, divided by the summation of wattage recharged (Egsum).

The formula is:

$$\%Rcompfull = (B\_Caprep/DisChgTotCyc)*100 \qquad \text{(eq. 9.)}$$

The corresponding results for each re-charge goal is displayed on the Energy/Time Recharging Monitor Screen 600.

Batteries charge more slowly as charging nears the total battery capacity. In the case of generator re-charging to the replenishment goal, conservation of generator fuel results are compared to always requiring a full charge from the generator. Generator fuel is at times of limited quantity. For the case of renewable energy sources (solar panel or wind powered generator), there is benefit in the user being informed that sufficient charge replenishment has been achieved to meet the needs of the next twenty-four hours.

Intended Use

This enhanced battery charging/discharging monitor is intended to be useful for RV users when camping off grid, watercraft at sea and off grid homeowners (i.e., Alaska). However, the battery monitoring system 108 is not limited to these applications. Any battery-operated system, which would provide any or all of the functions listed in the claims is within the scope of this patent.

The claims below may contain functional language. The claims do not include any statements of intended use.

The invention claimed is:
1. A battery monitoring system comprising:
a. at least one battery;
b. at least one source of electrical current operable to charge said battery;
c. a plurality of electrical load supplied by said at least one battery;
d. a plurality of sensors connected between said at least one battery and said battery monitoring system comprising:
   i. a current sensor;
   ii. a battery environmental temperature sensor; and
   iii. a voltage sensor;
e. a processor operable to:
   i. receive sensor inputs from said plurality of sensors;
   ii. receive user inputs from a user via a graphic user interface;
   iii. calculate a plurality of battery parameters from said sensor inputs and said user inputs; and
   iv. display said battery parameters on said graphic user interface; and present a "what if" graphic user interface screen:
      1. listing a plurality of electrical loads connected or connectable to said at least one battery;
      2. listing corresponding battery time to be saved by turning off each electrical load of said plurality of electrical loads;
      3. providing a first touchscreen panel enabling a user to hypothetically turn off various electrical loads of said plurality of electrical loads to gain said corresponding battery time to be saved;
      4. listing corresponding battery time to be lost by turning on each electrical load of said plurality of electrical loads;

5. providing a second touch screen panel enabling a user to hypothetically turn on various electrical loads of said plurality of electrical loads to use said corresponding battery time to be lost;
6. displaying current energy time remaining;
7. displaying hypothetical energy time remaining given user selections of said loads to turn on and said loads to turn off; and f. a non-volatile memory in communication with said processor.

2. The system of claim 1, comprising a touch screen window on said "what if" graphic user interface screen operable, when selected, to clear said first and second touch screens of all selections.

3. The system of claim 1, comprising:
   a. a data entry screen operable to receive data including battery type, battery age, battery rating in ampere-hours, identification of each electrical load connected or connectable to said battery, and benchmark of energy usage for each electrical load including start-up usage and steady-state usage; and
   b. storage of said received data in said non-volatile memory.

4. The system of claim 1, wherein said processor continuously calculates energy drain for cycling energy usage loads; constant uninterruptable energy usage loads; and controllable, constant drain, energy usage loads; and stores short-term and long-term averages of energy use in said non-volatile memory to be used for calculating predictions of the energy time remaining value.

5. The system of claim 1, comprising a battery monitor screen operable to be displayed on said graphic user interface showing pluralities of sensed and calculated electrical parameters of said battery.

6. The system of claim 1, wherein said calculated parameters comprise calculations based on derated values for battery capacity, as follows:
   a. a standard lead-acid battery capacity is derated:
      i. fifty percent;
      ii. plus forty percent after five hundred charge/discharge cycles; and
      iii. plus 0.55% per degree of temperature below 73 degrees Fahrenheit;
   b. a deep-cycle lead-acid battery capacity is derated:
      i. thirty-five percent;
      ii. plus forty percent after eight hundred charge/discharge cycles; and
      iii. plus 0.55% per degree of temperature below 73 degrees Fahrenheit; and
   c. a lithium battery capacity is derated:
      i. twenty percent;
      ii. plus twenty percent after two thousand charge/discharge cycles; and
      iii. plus 0.55% per degree of temperature below 73 degrees Fahrenheit.

7. The system of claim 1, comprising a battery monitor screen operable to be displayed on said graphic user interface showing an energy/time recharging monitor screen showing recharging parameters for said battery.

8. The system of claim 7, wherein said energy/time recharging monitor screen indicates progress on two recharge goals, said goals comprising:
   a. recharging until said battery is full; and
   b. recharging until said battery is adequately charged for twenty-four hours of service.

9. The system of claim 7, wherein said energy/time recharging monitor screen comprises an indicator that said recharging is steady or that said recharging is varying.

10. A battery monitoring system comprising:
    a. at least one battery;
    b. at least one source of electrical current operable to charge said battery;
    c. a plurality of electrical load supplied by said at least one battery;
    d. a plurality of sensors connected between said at least one battery and said battery monitoring system comprising:
       i. a current sensor;
       ii. a battery environmental temperature sensor; and
       iii. a voltage sensor;
    e. a processor operable to:
       i. receive sensor inputs from said plurality of sensors;
       ii. receive user inputs from a user via a graphic user interface;
       iii. calculate a plurality of battery parameters from said sensor inputs and said user inputs; and
       iv. display said battery parameters on said graphic user interface; and present a "what if" graphic user interface screen:
          1. listing a plurality of electrical loads connected or connectable to said at least one battery;
          2. listing corresponding battery time to be saved by turning off each electrical load of said plurality of electrical loads;
          3. providing a first touchscreen panel enabling a user to hypothetically turn off various electrical loads of said plurality of electrical loads to gain said corresponding battery time to be saved;
          4. listing corresponding battery time to be lost by turning on each electrical load of said plurality of electrical loads;
          5. providing a second touch screen panel enabling a user to hypothetically turn on various electrical loads of said plurality of electrical loads to use said corresponding battery time to be lost;
          6. displaying current energy time remaining;
          7. displaying hypothetical energy time remaining given user selections of said loads to turn on and said loads to turn off;
    f. a non-volatile memory in communication with said processor;
    g. a data entry screen operable to receive data including battery type, battery age, battery rating in ampere-hours, identification of each electrical load connected or connectable to said battery, and a benchmark of energy usage for each electrical load including start-up usage and steady-state usage; and
    h. storage of said received data in said non-volatile memory.

11. The system of claim 10, wherein said processor continuously calculates energy drain for cycling energy usage loads; constant uninterruptable energy usage loads; and controllable, constant drain, energy usage loads; and stores short-term and long-term averages of energy use in said non-volatile memory to be used for calculating predictions of the energy time remaining value.

12. The system of claim 10, comprising:
    a. a battery monitor screen operable to be displayed on said graphic user interface showing pluralities of sensed and calculated electrical parameters of said battery;

b. wherein said calculated parameters comprise calculations based on derated values for battery capacity, as follows:
   i. a standard lead-acid battery capacity is derated:
      1. fifty percent;
      2. plus forty percent after five hundred charge/discharge cycles; and
      3. plus 0.55% per degree of temperature below 73 degrees Fahrenheit;
   ii. a deep-cycle lead-acid battery capacity is derated:
      1. thirty-five percent;
      2. plus forty percent after eight hundred charge/discharge cycles; and
      3. plus 0.55% per degree of temperature below 73 degrees Fahrenheit; and
   iii. a lithium battery capacity is derated:
      1. twenty percent;
      2. plus twenty percent after two thousand charge/discharge cycles; and
      3. plus 0.55% per degree of temperature below 73 degrees Fahrenheit.

13. The system of claim 10, comprising a battery monitor screen operable to be displayed on said graphic user interface showing:
   a. an energy/time recharging monitor screen showing recharging parameters for said battery;
   b. wherein said energy/time recharging monitor screen indicates progress on two recharge goals, said goals comprising:
      i. recharging until said battery is full; and
      ii. recharging until said battery is adequately charged for twenty-four hours of service; and
      iii. wherein said energy/time recharging monitor screen comprises an indicator that said recharging is steady or that said recharging is varying.

14. A battery monitoring system operable to:
   a. continuously change the calculation of the battery's useful capacity as a result of battery age, battery number of charge/discharge cycles, and current battery environmental temperature measurement;
   b. continuously calculate energy drain for cycling energy usage electrical loads, constant uninterruptable energy usage electrical loads, and controllable, constant drain, energy usage electrical loads and stores short term and long-term averages of energy use in non-volatile memory to be used for calculations of the energy time remaining value;
   c. provide "What-If" capability for hypothetical changes in energy usage, and where a prediction of the resulting configuration in units of energy time remaining is displayed; and
   d. provides for two different charging goals, a full charge where a battery is completely re-charged, and a partial recharge goal which re-charges the battery sufficiently to provide power over the next twenty-four-hour period plus a safety margin amount, and displays progress toward both goals.

15. The system of claim 14, comprising a plurality of sensors including a battery voltage sensor, a battery current sensor and a battery environmental temperature sensor providing sensor input to said battery monitor system.

16. The system of claim 14, comprising a "What-If" touch screen having a list of actual and potential electrical loads which may be selected or deselected by a user to provide a hypothetical estimation of the energy use of any user-selected configuration of electrical loads.

17. The system of claim 16, comprising a battery derating value that is a function of battery type, number of battery recharge cycles, and battery environmental temperature used in calculating a value for said energy time remaining.

18. The system of claim 16, comprising a processor configured to calculate battery deratings as:
   a. a standard lead-acid battery capacity is derated:
      i. fifty percent;
      ii. plus forty percent after five hundred charge/discharge cycles; and
      iii. plus 0.55% per degree of temperature below 73 degrees Fahrenheit;
   b. a deep-cycle lead-acid battery capacity is derated:
      i. thirty-five percent;
      ii. plus forty percent after eight hundred charge/discharge cycles; and
      iii. plus 0.55% per degree of temperature below 73 degrees Fahrenheit; and
   c. a lithium battery capacity is derated:
      i. twenty percent;
      ii. plus twenty percent after two thousand charge/discharge cycles; and
      iii. plus 0.55% per degree of temperature below 73 degrees Fahrenheit.

19. The system of claim 18, wherein said processor is operable to:
   a. receive sensor inputs from said plurality of sensors;
   b. receive user inputs from a user via a graphic user interface;
   c. calculate a plurality of battery parameters from said sensor inputs and said user inputs; and
   d. display said battery parameters on said graphic user interface; and present a "what if" graphic user interface screen:
      i. listing a plurality of electrical loads connected or connectable to said at least one battery;
      ii. listing corresponding battery time to be saved by turning off each electrical load of said plurality of electrical loads;
      iii. providing a first touchscreen panel enabling a user to hypothetically turn off various electrical loads of said plurality of electrical loads to gain said corresponding battery time to be saved;
      iv. listing corresponding battery time to be lost by turning on each electrical load of said plurality of electrical loads;
      v. providing a second touch screen panel enabling a user to hypothetically turn on various electrical loads of said plurality of electrical loads to use said corresponding battery time to be lost;
      vi. displaying current energy time remaining;
      vii. displaying hypothetical energy time remaining given user selections of said loads to turn on and other said loads to turn off;
   e. a non-volatile memory in communication with said processor;
   f. a data entry screen operable to receive data including battery type, battery age, battery rating in ampere-hours, identification of each electrical load connected or connectable to said battery, and a benchmark of energy usage for each electrical load including start-up usage and steady-state usage; and
   g. storage of said received data in a non-volatile memory.

20. The system of claim 19, comprising a battery monitor screen operable to be displayed on said graphic user interface showing:

a. an energy/time recharging monitor screen showing recharging parameters for said battery;
b. wherein said energy/time recharging monitor screen indicates progress on two recharge goals, said goals comprising:
   i. recharging until said battery is full; and
   ii. recharging until said battery is adequately charged for twenty-four hours of service; and
   iii. wherein said energy/time recharging monitor screen comprises an indicator that said recharging is steady or that said recharging is varying.

* * * * *